(12) United States Patent  
Wilson

(10) Patent No.: US 7,608,195 B2
(45) Date of Patent: Oct. 27, 2009

(54) HIGH ASPECT RATIO CONTACTS

(75) Inventor: Aaron R. Wilson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 474 days.

(21) Appl. No.: 11/358,659

(22) Filed: Feb. 21, 2006

(65) Prior Publication Data

US 2007/0197033 A1 Aug. 23, 2007

(51) Int. Cl.
*H01L 21/302* (2006.01)

(52) U.S. Cl. .................. 216/67; 438/668; 438/700; 438/714; 438/723; 438/734

(58) Field of Classification Search .......... 438/714, 438/723, 734, 743, 668; 216/67, 80
See application file for complete search history.

(56) References Cited

U.S. PATENT DOCUMENTS

| | | | |
|---|---|---|---|
| 5,320,981 A | | 6/1994 | Blalock |
| 5,648,640 A * | | 7/1997 | Osborn ................ 174/84 R |
| 6,191,043 B1 * | | 2/2001 | McReynolds ............ 438/710 |
| 6,228,775 B1 | | 5/2001 | Coburn et al. |
| 6,242,165 B1 | | 6/2001 | Vaartstra |
| 6,475,920 B2 | | 11/2002 | Coburn et al. |
| 6,506,674 B2 * | | 1/2003 | Ikeda et al. ................ 438/637 |
| 6,716,758 B1 * | | 4/2004 | Donohoe et al. ............ 438/706 |
| 6,827,869 B2 * | | 12/2004 | Podlesnik et al. ........... 216/17 |
| 6,897,153 B2 * | | 5/2005 | Kwean et al. ............... 438/706 |
| 7,053,002 B2 * | | 5/2006 | Cohen et al. ............... 438/714 |
| 2004/0219790 A1 | | 11/2004 | Wilson |
| 2006/0175292 A1 * | | 8/2006 | Hanewald et al. ........... 216/67 |
| 2007/0131652 A1 * | | 6/2007 | Okune et al. .............. 216/67 |
| 2008/0057724 A1 * | | 3/2008 | Kiehlbauch et al. ........ 438/706 |
| 2008/0286979 A1 * | | 11/2008 | Shin et al. ................. 438/714 |

FOREIGN PATENT DOCUMENTS

| | | | |
|---|---|---|---|
| EP | 0596593 A1 | | 5/1994 |
| JP | 03-222327 | * | 10/1991 |
| JP | 08064575 | | 3/1996 |
| JP | 2000-223478 | * | 8/2000 |

(Continued)

OTHER PUBLICATIONS

"Fabrication of sub-0.1 mu contacts with 193 nm CARL photolithography by a combination of ICP dry development and MORI HDP oxide etch"; Proceedings-Electrochemical Society (2000'), 99-30 (Plasma Etching Processes for Sub-Quarter Micron Devices), pp. 226-232; Song et al.*

(Continued)

*Primary Examiner*—Anita K Alanko
(74) *Attorney, Agent, or Firm*—Brooks, Cameron & Huebsch, PLLC

(57) ABSTRACT

A process for etching a insulating layer to produce an opening having an aspect ratio of at least 15:1 by supplying a first gaseous etchant having at least fifty (50) percent He to a plasma etch reactor, and exposing the insulating layer to a plasma of the first gaseous etchant. Use of the first gaseous etchant reduces the occurrence of twisting in openings in insulating layers having an aspect ratio of at least 15:1.

30 Claims, 7 Drawing Sheets

FOREIGN PATENT DOCUMENTS

| | | |
|---|---|---|
| JP | 20020223478 | 8/2000 |
| WO | WO 2005/022623 | 3/2005 |

OTHER PUBLICATIONS

Fuard, D., et al. "Etch mechanisms of low dielectric constant polymers in high density plasmas: . . . ", J. Vac. Sci Technol. B 19(6), 2223-2230 (Nov./Dec. 2001).

Hwang, Gyeong S., et al. "Ion mass effect in plasma-induced charging", Appl. Phys. Lett., 71 (14), 1942-1944 (Oct. 6, 1997).

Matsui, Jun, et al., "The effect of topographical local charging on the etching of deep-submicron structures in SiO2 . . . ", Appl. Phys. Lett. 78 (7), 883-885 (Feb. 12, 2001).

Noda, Shuichi, et al., "Investigation of ion transportation in high-aspect-ratio holes from fluorocarbon plasma for SiO2 etching", Thin Solid Films 374, 181-189 (2000).

Schaepkens, Marc, et al., "Asymmetric microtrenching during inductively coupled plasma oxide etching . . . ", Appl. Phys. Lett., 72 (11) 1293-1295 (Mar. 16, 1998).

Ikegami, Naokatsu, et al., "[XP-000732360]Characteristics of Very High-Aspect Ration Contact Hole Etching", Jpn. J. Appl. Phys., vol. 30, pp. 2470-2476 (1997).

International Search Report (6 pgs.).

* cited by examiner 0.166μm 0.175μm

HIGH ASPECT RATIO CONTACTS

TECHNICAL FIELD

The invention relates to semiconductors and semiconductor fabrication methods. More particularly, the invention relates to high aspect ratio openings in insulating layers and plasma etching methods for formation of high aspect ratio openings.

BACKGROUND OF THE INVENTION

During the formation of semiconductor devices, such as dynamic random access memories (DRAMs), insulating layers are used to electrically separate conductive layers. It is often required that the conductive layers be interconnected through openings in the insulating layer. Such openings are commonly referred to as contact holes (i.e., an opening extending through an insulating layer to an active device area) or vias (i.e., an opening extending through an insulating layer between two conductive layers).

The profile of an opening is of particular importance such that it exhibits specific characteristics when the contact hole or via is provided or filled with a conductive material. As minimum feature dimensions of devices decrease, the aspect ratio (the ratio of depth to width) of the openings needs to increase. As the aspect ratio increases, however, a phenomenon termed "twisting" can occur. Twisting occurs when the etch front of the opening starts deviating from what is perpendicular to the semiconductor substrate surface, for example, openings in the shape of a corkscrew are possible. The twisting phenomenon with respect to high aspect ratio (HAR) openings is problematic in that twisting reduces the efficiency of a contact by increasing the distance between active device areas and by increasing the difficulty of filling a contact with a conductive material. As such, a suitable solution to the twisting phenomenon in HAR etch processes is desired.

SUMMARY OF THE INVENTION

Embodiments of the present disclosure include a process for etching an insulating layer with a first gaseous etchant having a flow rate (square cubic centimeters per minute (sccm)) at least fifty (50) percent helium (He). According to the present disclosure, twisting phenomenon in high aspect ratio contacts (HARCs) can be reduced through the use of the first gaseous etchant as described in the present disclosure. In other embodiments, the first gaseous etchant used to etch HARCs is a mixture of Ar and He. In one embodiment, the first gaseous etchant can be a mixture of about ninety (90) percent He and about ten (10) percent Ar. In yet another embodiment, the first gaseous etchant is He.

As used herein, the term "high aspect ratio contact" (HARC) includes contacts, openings, vias, and/or trenches in an insulating layer having an aspect ratio (the ratio of depth to width) of at least 15:1 for a depth dimension of about 80 nm. As used herein, the term "insulating layer" includes those materials used to separate conductive layers. Examples of insulating layers include silicon dioxide, phosphorous doped silicon dioxide, or a dielectric such as silicate glass, silicon oxide, silane, tetraethyl orthosilicate (TEOS), polytetrafluoroethylene (PTFE), or silicon nitride. Other exemplary materials include, but are not limited to, cured hydrogen or methyl silsesquioxane compositions, the various PolyArylene Ether (PAE) polymers such as SiLK® manufactured by The Dow Chemical Company of Midland, Mich., Velox™ manufactured by Schumacher of Carlsbad, Calif., or FLARE™ manufactured by Honeywell of Morristown, N.J.

During the formation of HARCs, second gaseous etchants, not necessarily containing He, such as argon (Ar), xenon (Xe), and combinations thereof, can first be used to form openings having aspect ratios of less than about 15:1. As the aspect ratio approaches the 15:1 value, the composition of the second gaseous etchant can be exchanged to a first gaseous etchant having at least fifty (50) percent He.

In an additional embodiment, a process is provided that etches an insulating layer with a plasma of a heavy ion to produce an opening. Once the opening reaches an aspect ratio of about 15:1, the heavy ion is exchanged for a light ion to etch the opening to an aspect ratio of at least 20:1.

In another embodiment, a process is provided that etches an insulating layer with a plasma of a gaseous etchant to produce a HARC. Further, the HARC has an elongate, symmetrical shape and an aspect ratio of about at least 15:1 for a depth dimension of about 80 nm. Embodiments of the present disclosure can also be used to form HARCs having an aspect ratio of at least 20:1. In one embodiment, a contact is formed in a insulating layer where the opening allows an axis perpendicular to the insulating layer to pass through the opening to the bottom uninterrupted by the side of the opening. Further, the contact has an opening that defines an essentially elongate symmetrical shape with an aspect ratio of at least 20:1 for a depth dimension of greater than eighty (80) nm. In another embodiment, the contact receives layers to form a capacitor to be used in a memory device, such as random access memory (RAM), dynamic random access memory (DRAM), or static random access memory (SRAM).

As used herein, the term "semiconductor substrate" or "semiconductive substrate" is defined to mean any construction comprising semiconductive material, including, but not limited to bulk semiconductive materials such as a semiconductive wafer (either alone or in assemblies comprising other materials thereon), and semiconductive material layers (either alone or in assemblies comprising other materials). As used herein, the term "substrate" refers to any supporting structure, including, but not limited to, the semiconductive substrates described herein. As used herein, the term "layer" encompasses both the singular and the plural unless otherwise indicated. As used herein, the term "twisting" or "twisting phenomenon" refers to when the etch front of the opening deviates from what is perpendicular to the semiconductor substrate surface.

It is to be understood that the first gaseous etchant and second gaseous etchant act as inert gases in conjunction with a reactive gas to etch the dielectric. Therefore, as a reactive gas is added, the flow rate (square cubic centimeters per minute (sccm)) of the first and second gaseous etchants would be adjusted while keeping their relative amounts the same. The reactive gas may be any gaseous material known for etching. Examples of suitable reactive gases for use with the present disclosure include: hydrogen bromine (HBr), chloride ($Cl_2$) carbon tetrafluoride ($CF_4$), trifluoromethane ($CHF_3$), and the like. It should be understood that the selection of the reactive gas will be determined by the substrate to the etched as well as the physical parameters of the etching process such as power, pressure, temperature, and the like.

It is to be understood that all percentage values of etchant materials are flow rate percentages. For example, a first gaseous etchant having at least fifty (50) percent helium (He) would mean that of the gases flowing into a plasma reactor, fifty (50) percent of the square cubic centimeters per minute (sccm) is He.

DETAILED DESCRIPTION

Figure 1:
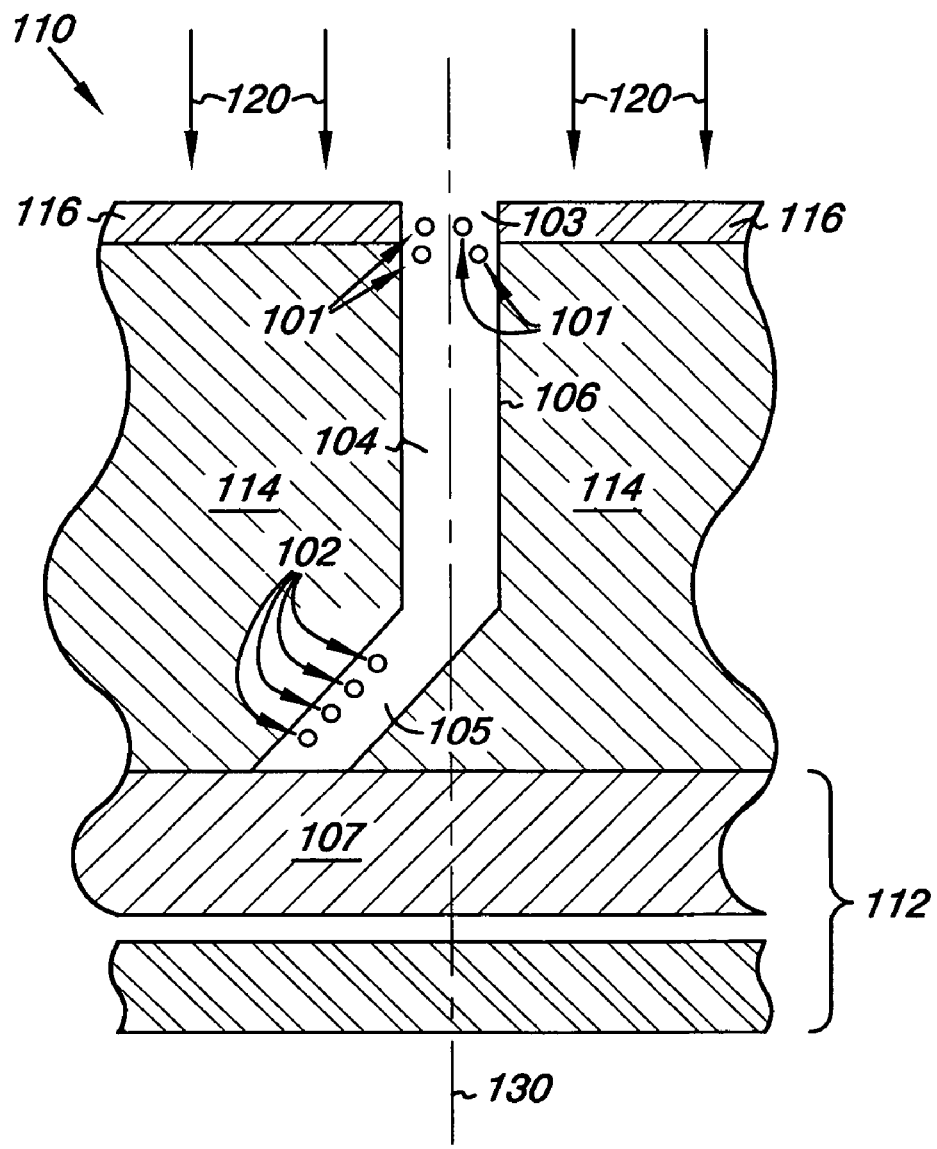
FIG. 1 illustrates a cross section of a structure illustrating the twisting phenomenon.

The Figures herein follow a numbering convention in which the first digit or digits correspond to the drawing Figure number and the remaining digits identify an element or component in the drawing. Similar elements or components between different Figures may be identified by the use of similar digits. For example, 110 may reference element "10" in FIG. 1, and a similar element may be referenced as 210 in FIG. 2. It should also be apparent that the scaling on the figures does not represent precise dimensions of the various elements illustrated therein.

Producing high aspect ratio contacts (HARCs) with aspect ratios of greater than 15:1 has proven difficult due to twisting phenomenon. FIG. 1 provides an illustration of twisting phenomenon. As illustrated, electrons 101 will mainly strike the insulating layer 114 defining the opening 104 near the top 103 of the opening; while positive ions 102 will reach the bottom 105 of the opening. This is what causes the top 103 of the opening to charge negative while the bottom 105 of the opening 104 charges positive. The charge at the bottom 105 of the opening will result in off-axis ions being repelled to the side 106 of the opening 104.

Figure 2:
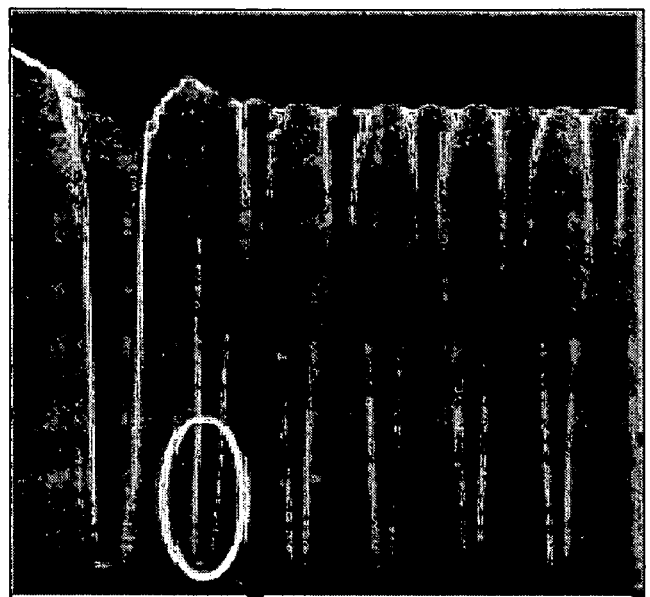
FIGS. 2 and 3 are pictures showing the twisting phenomenon.
Figure 3:
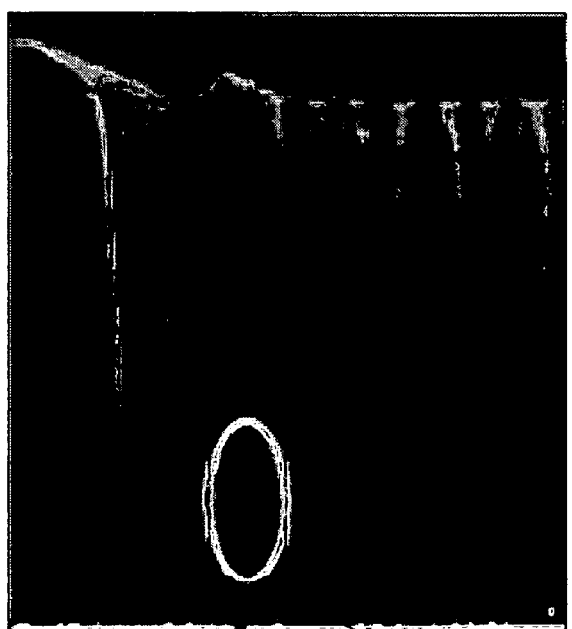

In addition, small asymmetries in the top 103 of the opening 104, due to photolithography or polymer loading, can also cause asymmetric charging at the top 103 of the opening 104 leading to bending of the incident ions 102. This may then cause the opening 104 to etch faster on one side 106 due to increased ion 102 flux to one area. Other illustrations of openings exhibiting the twisting phenomenon (circled) are shown in FIGS. 2 and 3.

Often in contact hole or via etching the process starts out etching normally (e.g., no twisting), but at a certain aspect ratio the etching action begins to twist. In some instances this transition occurs at an aspect ratio of approximately 15:1 for a depth dimension of about eighty (80) nm. Twisting is particularly problematic in etching processes that use heavy ions (e.g., argon (Ar) and xenon (Xe)), where the etching plasma has a large energy disparity between the ion and electron. The large energy disparity results in the heavy ions reaching the opening with a more vertical velocity than the corresponding electron from the plasma. As a result, as the aspect ratio increases above 15:1 for a depth dimension of about 80 nm, ions begin to accumulate at the bottom of the opening. As additional ions continue to be introduced into the opening they are focused and defocused by the electric fields, causing profile distortion and a reduction in etch rate. The reduction in etch rate is termed "aspect ratio dependent etch rate" due to changing etch rates as the aspect ratio of openings increases and is a result of charge buildup at the bottom of an opening. Also, if there are any asymmetries in the charge build due to pattern, polymer, or feature asymmetry, the twisting phenomena will result as the ions are focused to one side of the feature. Embodiments are not limited to the about eighty (80) nm depth dimension given in this example. Other depth dimensions are also possible, including those greater than eighty (80) nm and those less than eighty (80) nm.

Although the use of heavy ions produces twisted openings and reduced etch rate, plasma etching using heavy ions continues to predominate in current plasma etch processes due to its mask selectivity. Heavy ions display a mask selectivity that allows the plasma to more selectively etch the exposed insulating layer instead of the masking layer. So, despite the existence of the twisting and etch rate problem in high aspect ratio opening etches, mask selectivity continues to be one main reason for the use of the heavy ions in plasma etching.

Embodiments of the present disclosure help to reduce the twisting phenomenon and the etch rate reduction in openings formed in insulating layers. Despite the conventional preference for etching high aspect ratio opening in insulating layers with heavy ions, the embodiments of the present disclosure have surprisingly discovered that the use of plasma from light, low energy ions is highly effective in reducing or eliminating twisting in forming HARCs through insulating layers.

While not wishing to be bound by theory, it is believed that the use of light, low energy ions of the present disclosure to etch openings having an aspect ratio of at least 15:1 at about an eighty (80) nm depth dimension results in a reduction of the energy disparity between the ion and the electron of the plasma. Because of the low energy disparity the ions are able to neutralize the negative charge at the top of the openings. This facilitates the entry of more electrons into the openings. Positive charges from the ions at the bottom of the openings are then neutralized by the electrons entering the openings. As additional ions are introduced into the opening, they continue to etch without being repelled into the side of the opening. As a result, twisting of the opening is reduced for openings having an aspect ratio of at least 15:1 or greater with at least an eighty (80) nm depth dimension. Also, as the aspect ratio increases, it is not accompanied by the usual charge buildup which affects the etch rate. Therefore, the use of light, low energy ions also eliminates the aspect ratio dependent etch rate enabling the etch rate to remain approximately constant throughout the etch.

Figure 4:
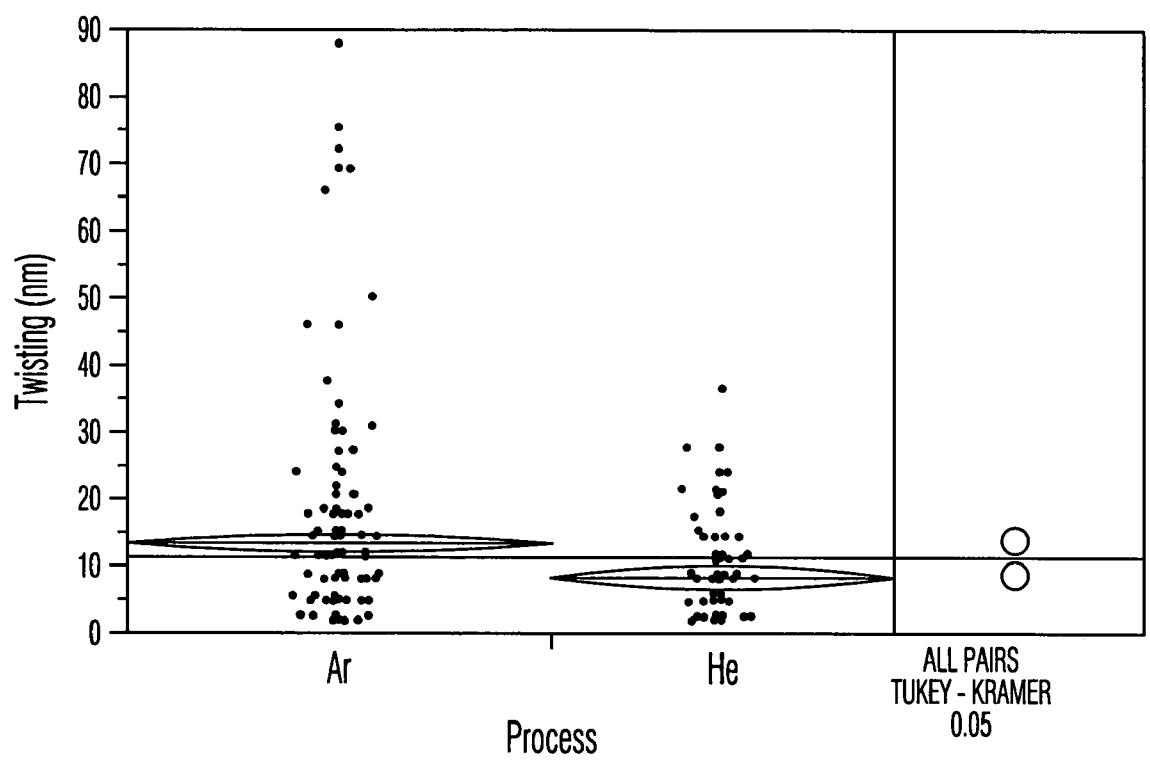
FIG. 4 is a graph providing twisting data for openings formed with a gaseous etchant of He versus Ar.

As used herein, light, low energy ions for use as a plasma etchant include those from helium (He). In various embodiments, a first gaseous etchant having at least fifty (50) percent He is used to etch a insulating layer. The result has been a reduction in the twisting phenomenon seen in etching openings in insulating layers. FIG. 4 provides a comparison of the twisting phenomenon observed in openings etched when the first gaseous etchant has at least fifty (50) percent He versus the first gaseous etchant being predominantly Ar. The twisting in FIG. 4 was measured by analyzing the deviation of the etched opening from an imaginary center line extending through the center of the top of the opening. As shown, the processes using He show a smaller range of twisting and do not show twisting greater than about forty (40) nanometers (nm) from the center line as compared to the twisting observed for the processes using predominantly Ar.

In the various embodiments, openings having an aspect ratio of at least 15:1 can be etched with the plasma of a first gaseous etchant containing at least fifty (50) percent He. As will be discussed herein, other gases can be used with He to form the plasma of the first gaseous etchant.

Although the use of a first gaseous etchant containing at least fifty (50) percent He produces significantly less twisting than processes without He, current practices have tended away from using He due to its poor mask selectivity. For example, using He in the first gaseous etchant can lead to both the mask layer and the insulating layer being etched.

To minimize the mask selectivity issue, embodiments of the present disclosure provide a significant portion of He to the first gaseous etchant once the phenomenon of twisting begins to be observed in openings in insulating layers. In the embodiments of the present disclosure, twisting typically begins to be observed at openings in insulating layers having an aspect ratio of at least 15:1. By adding He to the first gaseous etchant once the opening has reached an aspect ratio of at least 15:1, the opening can be etched to an aspect ratio of at least 20:1 or greater with less twisting than when He is not present. Also, since He is used for just a portion of the plasma etch, the effects of helium's poor mask selectivity is decreased.

One such embodiment first etches an opening in an insulating layer using a second gaseous etchant containing Ar, Xe, or combinations thereof until the opening has an aspect ratio of less than about 15:1. As will be appreciated, the second gaseous etchant can also include He. Then, once the opening has reached the aspect ratio of less than about 15:1, the second gaseous etchant containing Ar, Xe, or combinations thereof is exchanged for a first gaseous etchant containing at least fifty (50) percent He. The etching process can then continue further to produce an opening having an aspect ratio of at least 20:1.

Embodiments of the present disclosure further include the use of other gases with He to form the first gaseous etchant of the present disclosure. Examples of such other gases can be selected from gases such as Ar, Xe, krypton (Kr), bromine (Br), large fluorocarbon ions, and combinations thereof. For example, in one embodiment the opening having an aspect ratio of at least 15:1 can be etched with a first gaseous etchant containing about ninety (90) percent He and about ten (10) percent Ar. Selection of these additional gases can be based in part on the insulating layer to be etched. In addition, the additional gases used in conjunction with He can be used to lower the activation energy required to produce the plasma. As will be appreciated, it is also possible to use He as the gas for the first gaseous etchant. In other words, it is possible to use He as the gas for the first gaseous etchant without the addition of any additional gases.

An additional embodiment exposes the insulating layer to a plasma of a heavy ion gaseous etchant to etch an opening to an aspect ratio of less than about 15:1. Once the aspect ratio of the opening is about 15:1, the heavy ion gaseous etchant is exchanged for a light ion gaseous etchant to further etch the opening to an aspect ratio of at least 20:1. As will be appreciated, the heavy ion gaseous etchant includes a first inert gas and a first reactive gas and the light ion gaseous etchant includes a second inert gas and a second reactive gas. In one embodiment, the first and second inert gases are made up of heavy and light ions, respectively. Examples of heavy ions in the first inert gas include, but are not limited to Ar, Xe, Kr, Br, large fluorocarbon ions, and combinations thereof. Examples of light ions in the second inert gas include, but are not limited to, He, neon (Ne), chlorine (Cl), and fluorine (F) ions. In an additional embodiment, the first and second reactive gases are made up of heavy and light ions, respectively. An example of a heavy ion in the first reactive gas is Br. An example of a light ion in the second reactive gas is Cl.

A further embodiment of the present disclosure uses only a reactive gas to etch the openings. The embodiment exposes the insulating layer to a plasma of a heavy ion reactive gas etchant to etch an opening to an aspect ratio of less than about 15:1. Once the aspect ratio of the opening is about 15:1, the heavy ion reactive gas etchant is exchanged for a light ion gas etchant to further etch the opening to an aspect ratio of at least 20:1. As will be appreciated, the entire etch chemistry is exchanged once the aspect ratio reaches about 15:1 due to the absence of an inert gas.

Figure 5:
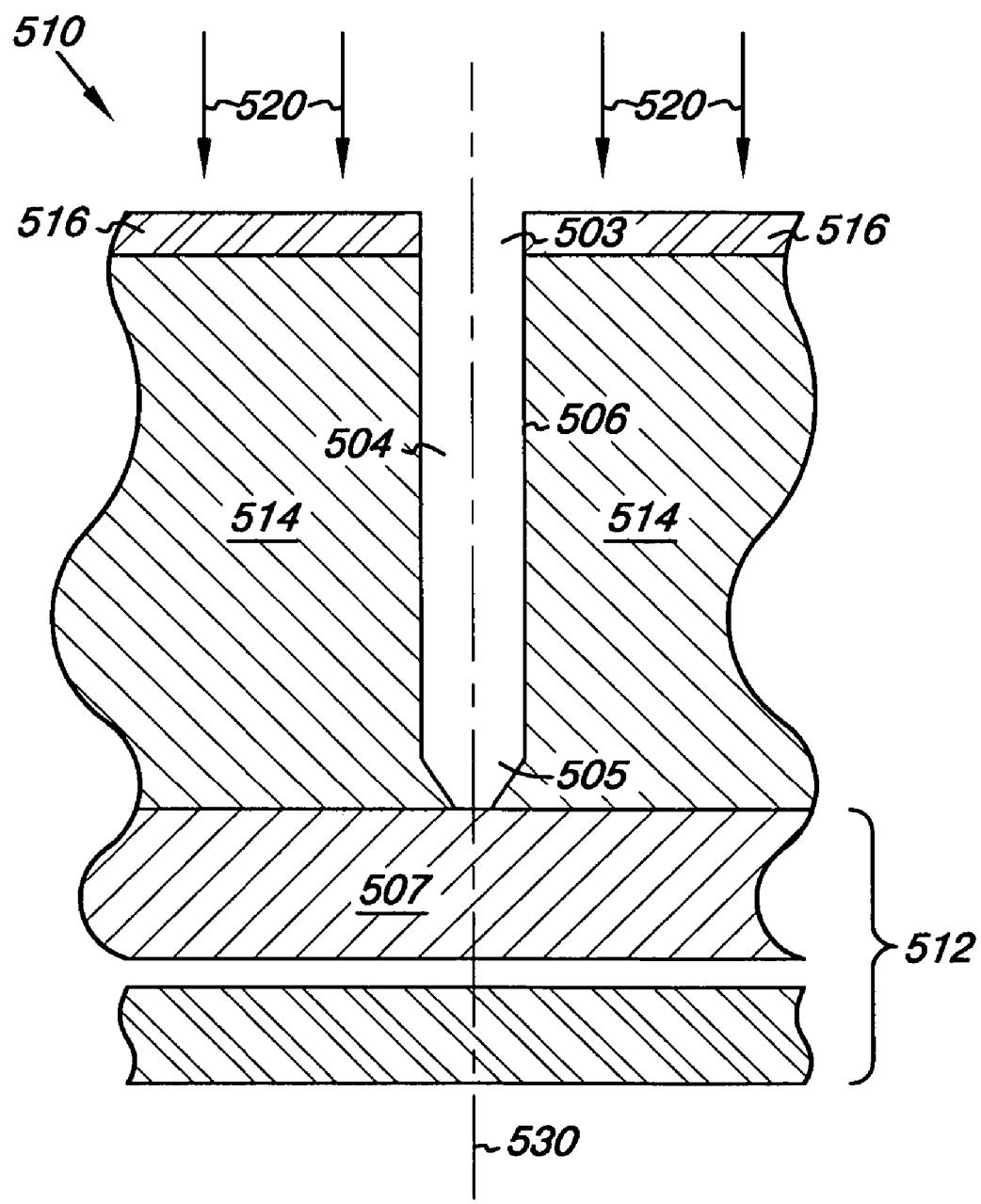
FIG. 5 illustrates an embodiment cross section of a resulting structure after performance of one etch method embodiment according to the present disclosure.

FIG. 5 illustrates an opening 504 in an insulating layer 514 produced according to the present disclosure. As shown, the opening 504 does not exhibit twisting. In particular, an axis 530 perpendicular to the insulating layer 514 can pass through the opening 504 uninterrupted by the side 506 of the opening 504. Also, the opening 504 defines an essentially elongate, symmetrical shape with an aspect ratio of about at least about 15:1. The opening 504 can also be formed in a insulating layer according to the processes described herein having an aspect ratio of at least 20:1.

In one embodiment, the opening 504 can be a contact, a via, or a trench. In another embodiment, the opening 504 is a contact with an aspect ratio of at least 20:1, produced according to the process described herein. In another embodiment, the depth of the contact is at least eighty (80) nm or greater. In still another embodiment, the opening receives layers to form a capacitor for use in a memory device. The memory device includes a transistor, a conductive line, and the capacitor contained in the insulating layer having an opening as described in the present disclosure with an aspect ratio of at least 20:1. The transistor and the capacitor are connected by the conductive line. The capacitor can also be fabricated as part of RAM, DRAM, or SRAM circuitry.

Additionally, FIG. 5 shows a substrate assembly 510 to be etched using a plasma from a first gaseous etchant 520 generated in accordance with the embodiments described herein. Substrate assembly 510 comprises an exemplary bulk substrate material 512, for example monocrystalline silicon. Of course, other materials and substrates are contemplated, including semiconductor-on-insulator and other substrates whether existing or yet-to-be developed.

A insulating layer 514 can be formed over substrate 512. An exemplary insulating layer is an oxide, such as TEOS, but can also be silicate glass, silicon oxide, silane, polytetraflouroethylene (PTFE), or silicon nitride. Other exemplary materials include, but are not limited to, cured hydrogen or methyl silsesquioxane compositions, the various PolyArylene Ether (PAE) polymers such as SiLK® manufactured by The Dow Chemical Company of Midland, Mich., Velox™ manufactured by Schumacher of Carlsbad, Calif., or FLARE™ manufactured by Honeywell of Morristown, N.J. A masking layer 516 is deposited over insulating layer 514. An exemplary mask material is a semi-hard amorphous carbon mask. Of course, multilayer or other masking layer processes are also contemplated, such as multilayer mask processing. It should be apparent to one skilled in the art that the structure may be used in the formation of various devices or circuits, such as SRAMS, DRAMs, etc.

The embodiments presented herein can also be beneficial for defining high aspect ratio openings through an insulating layer to any underlying material. As such, substrate 512 includes a surface region 507 to which the high aspect ratio opening 504 extends. Thus, the opening 504 provides for forming an interconnect, an electrode, etc., relative to the surface region 507 of substrate 512. For example, the surface region 507 may be any silicon containing region, e.g., a silicon nitride region or a doped silicon or doped polysilicon region. However, the present invention is in no manner limited to such silicon containing regions but is limited only in accordance with the accompanying claims. Such high aspect ratio features may be formed relative to any surface region 507 (e.g., silicon nitride, a metal interconnect, a metal silicide, dielectric material) of a substrate 512 for forming any number of features, such as a contact hole for an interconnect level, a gate electrode, a capacitor electrode, a via, etc. It should be recognized that the surface region 507 may be the same or different from the material of the remainder of substrate 512. For example, the surface region 507 may be of a continuous nature with the remainder of the substrate 512.

The etch of the insulating layer 514 is an anisotropic etch performed using a plasma from a first gaseous etchant 520 generated in accordance with the embodiments herein. The plasma may be generated utilizing any known suitable etching device, such as an etcher available from Applied Material under the trade designation of P5000 etcher, an etching apparatus as described in U.S. Pat. No. 4,298,443; a 9100 TCP Oxide Etcher available from Lam Research Corporation, or any other high density plasma etcher. It should be readily apparent to one skilled in the art that depending on the particular etching apparatus utilized to generate the plasma, various parameters may vary for accomplishing similar objectives.

Figure 6:
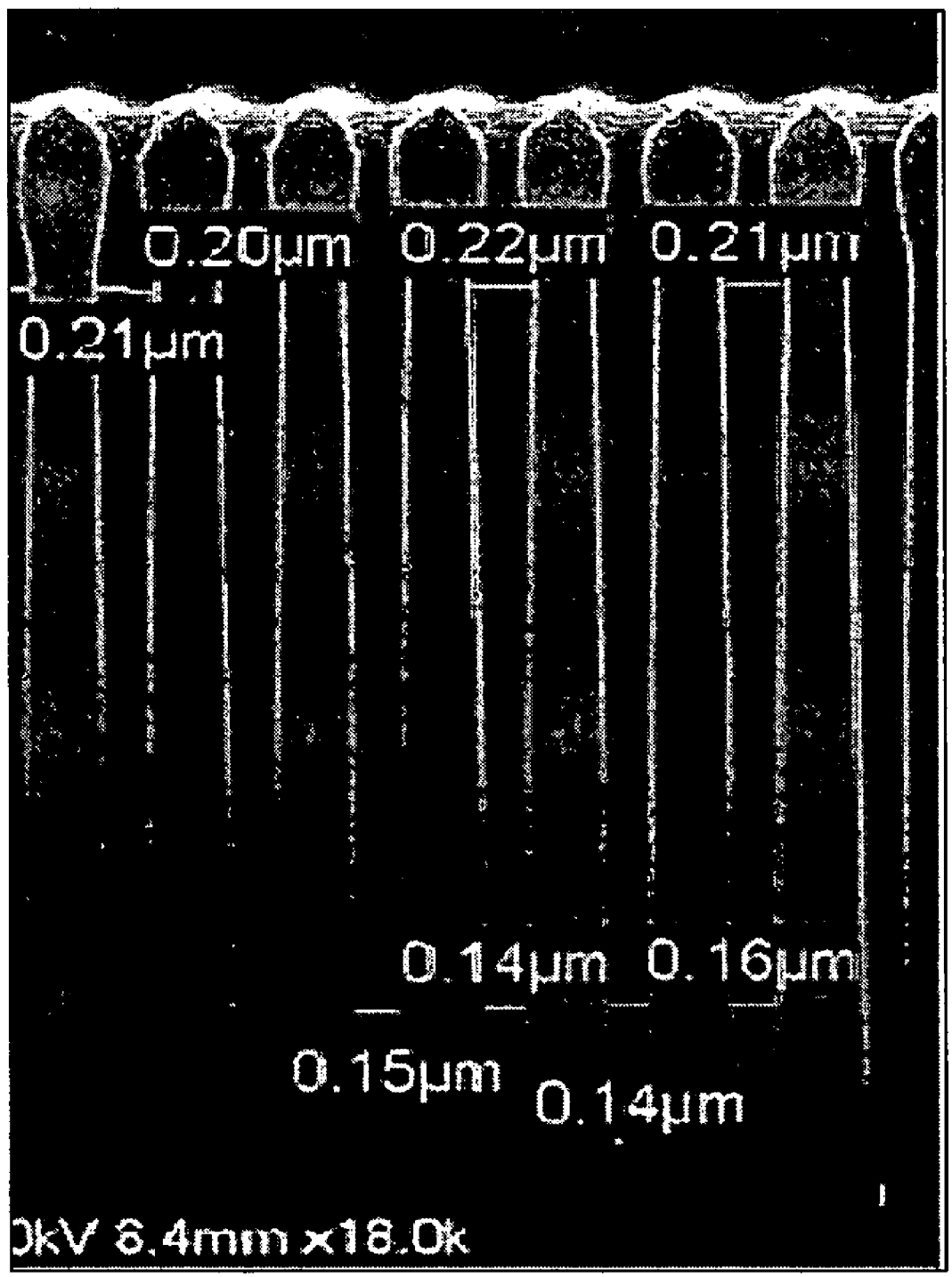
FIG. 6 is a picture showing one resulting structure embodiment after performance of an etch method according to the present disclosure.

By way of example, FIG. 6 provides a picture of an opening with no appreciable twisting in a insulating layer formed according to the present disclosure.

Figure 7:
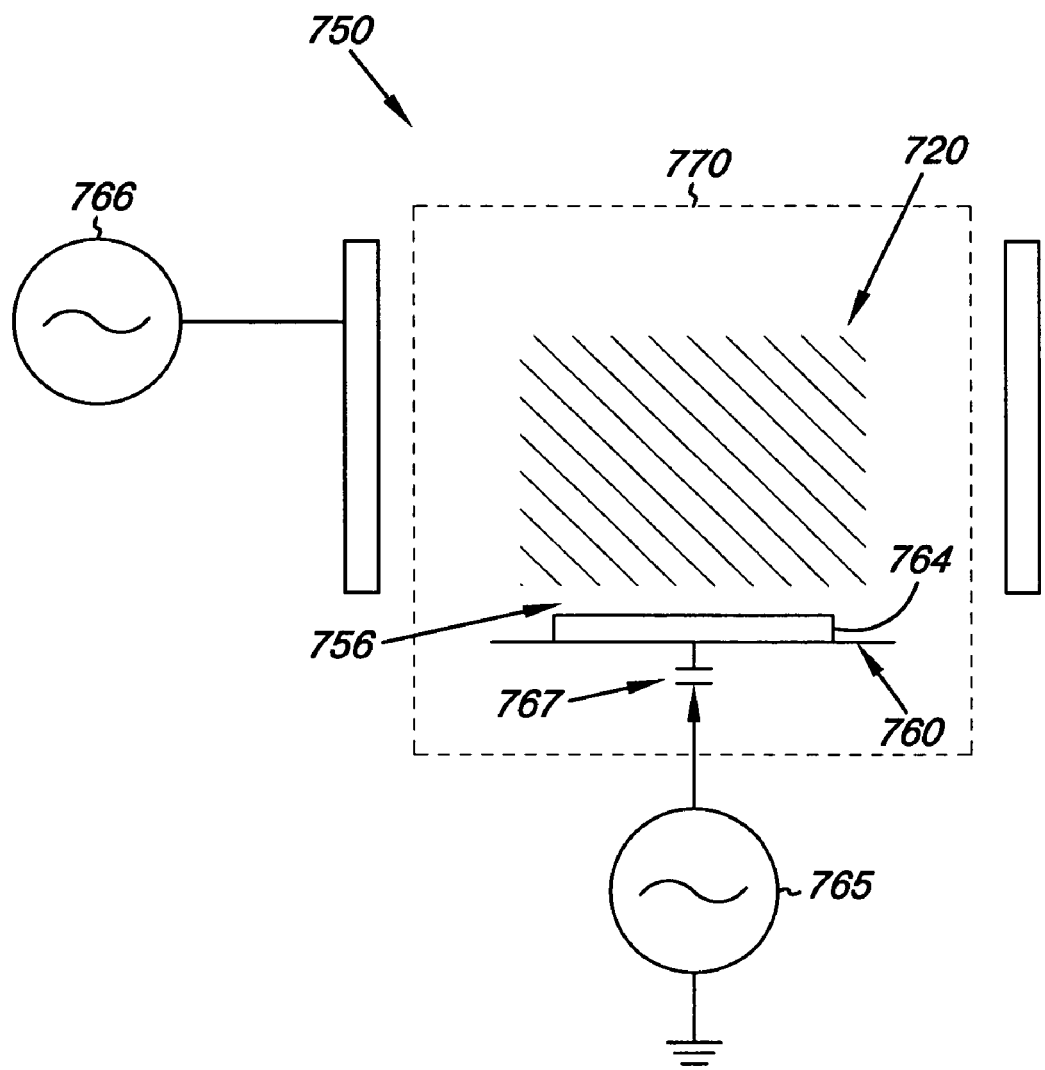
FIG. 7 illustrates a general diagram of a plasma generation device suitable for use with embodiments of the present disclosure.

FIG. 7 generally shows an illustrative etch reactor 750 for performing etching. It should be recognized that this is an illustrative diagram representative of an entire system even though only several components of the system are shown. Various systems incorporating many elements in various configurations may be utilized. To generate plasma 720, a gas according to the present disclosure is provided to the illustrative plasma generator 750. In one embodiment, the gas is provided to the plasma generation apparatus 750 containing at least fifty (50) percent He.

The illustrative etch reactor 750 includes a powered electrode 760 connected to an RF bias source 765 via capacitance 767 upon which a semiconductor substrate having a insulating layer to be etched is placed. Further, an RF source 766 is connected to elements, e.g., coils, for generating the plasma 720 in chamber 770. Ion sheath 756 is formed between the plasma 720 and the powered electrode 760. With the semiconductor substrate 764 positioned within the illustrative plasma generation apparatus 750, the insulating layer is etched in accordance with the embodiments resulting in the structure of FIG. 5. The power source 766 utilized may be any suitable power source including an RF generator, a microwave generator, etc. It will be readily apparent that any plasma etching system may be used.

Figure 8:
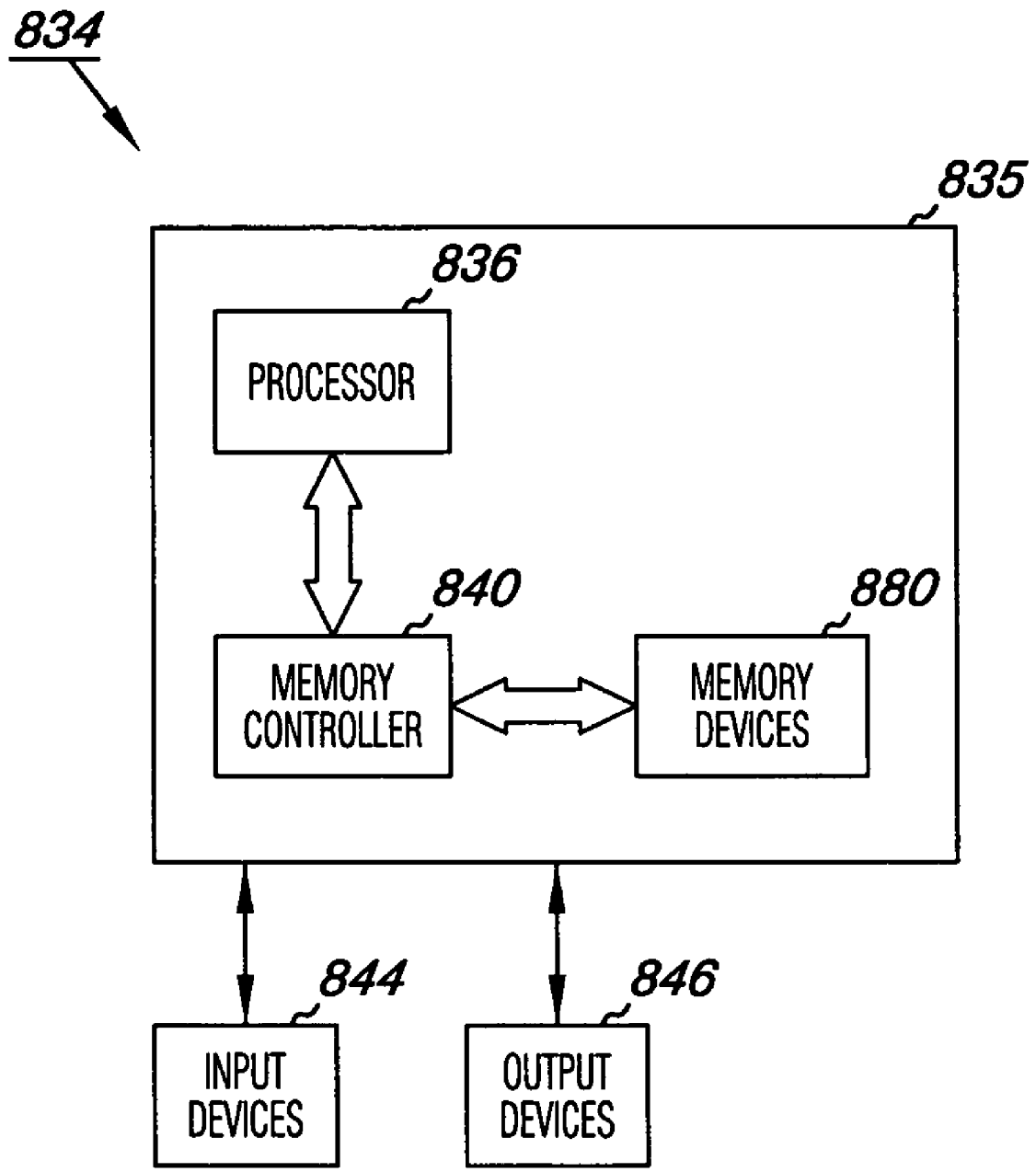
FIG. 8 illustrates a system having a memory device in which an opening according to various embodiments of the present disclosure can be used.

Embodiments of the present disclosure can also include a processor based system that incorporates the opening formed in the insulating layer according to the process embodiments described herein. For example, FIG. 8 provides an embodiment of a processor based system 834 that includes a capacitor contained in a insulating layer having an opening formed according to the present disclosure for use in a memory device 880. As shown in FIG. 8, the system 834 may also include one or more input devices 844, e.g., a keyboard, touch screen, transceiver, mouse, etc., connected to the computing unit 835 to allow a user to input data, instructions, etc., to operate the computing unit 835. One or more output devices 846 connected to the computing unit 835 may also be provided as part of the system 834 to display or otherwise output data generated by the processor 836. Examples of output devices include printers, video terminals, monitors, display units, etc.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A process for etching an insulating layer, comprising:
   first exposing the insulating layer to a second plasma of a second gaseous etchant comprising Ar, Xe, and combinations thereof to form an opening having an aspect ratio of less than 15:1; and
   second exposing the insulating layer to a first plasma of a first gaseous etchant having at least fifty percent helium (He) to etch the opening having an aspect ratio of at least 15:1, thereby increasing the aspect ratio to greater than 15:1,
   wherein the first gaseous etchant has a lower molecular weight than the second gaseous etchant.

2. The process of claim 1, wherein the second gaseous etchant includes He.

3. The process of claim 2, including:
   exchanging the second gaseous etchant for the first gaseous etchant once the aspect ratio of the etched openings reaches approximately 15:1.

4. The process of claim 1, where the insulating layer is an oxide selected from the group consisting of silicate glass, silicon oxide, a material formed using one or more silanes, and tetraethyl orthosilicate (TEOS).

5. The process of claim 1, where the first gaseous etchant is a mixture of He and Ar.

6. The process of claim 1, where the first gaseous etchant is approximately ninety percent He and approximately ten percent Ar.

7. The process of claim 1, where the first gaseous etchant is approximately one hundred percent He.

8. The process of claim 1, where the opening includes an opening selected from the group consisting of: vias, contacts, and trenches.

9. A process for etching an insulating layer, comprising:
   exposing the insulating layer in a plasma etch reactor to a plasma of a heavy ion gaseous etchant comprising,
      a first inert gas; and
      a first reactive gas, to etch an opening to an aspect ratio of less than approximately 15:1;
   exchanging the heavy ion gaseous etchant for a light ion gaseous etchant comprising,
      a second inert gas; and a second reactive gas, once the aspect ratio of the etched opening reaches approximately 15:1 to further etch the opening to an aspect ratio of at least 20:1; and wherein the light ion gaseous etchant has a lower mean molecular weight of the mixture of the second inert gas and the second reactive gas than the mean molecular weight of the first inert gas and the first reactive gas in the heavy ion gaseous etchant.

10. The process of claim 9, where the first inert gas is comprised of a heavy ion and the second inert gas is comprised of a light ion, wherein the light ion has a lower molecular weight than the heavy ion.

11. The process of claim 10, where the heavy ion is selected from the group consisting of Ar, Xe, krypton (Kr), bromine (Br), large fluorocarbon ions, and combinations there of, and the light ion is selected from the group consisting of He, neon (Ne), chlorine (Cl), and fluorine (F).

12. The process of claim 9, where the first reactive gas is comprised of a heavy ion and the second reactive gas is comprised of a light ion, wherein the light ion has a lower molecular weight than the heavy ion.

13. The process of claim 12, where the heavy ion is Br and the light ion is Cl.

14. A process for etching an insulating layer, comprising:
exposing the insulating layer in a plasma etch reactor to a plasma of a heavy ion reactive gas etchant to etch an opening to an aspect ratio of less than approximately 15:1;
exchanging the heavy ion reactive gas etchant for a light ion reactive gas etchant once the aspect ratio of the etched opening reaches approximately 15:1 to further etch the opening to an aspect ratio of at least 20:1; and
wherein the light ion reactive gas has a lower molecular weight than the heavy ion reactive gas.

15. The process of claim 14, where the heavy ion reactive gas etchant is Br and the light ion reactive gas etchant is Cl.

16. A process for etching an insulating layer, comprising:
first exposing the insulating layer to a second plasma of a second gaseous etchant comprising Ar, Xe, and combinations thereof to etch an opening up to an aspect ratio of approximately 15:1; and
second exposing the insulating layer to a first plasma of a first gaseous etchant having at least fifty percent He to etch the opening having an aspect ratio of at least 15:1, thereby increasing the aspect ratio to greater than 15:1,
wherein the first gaseous etchant has a lower molecular weight than the second gaseous etchant.

17. The process of claim 16, where the insulating layer is an oxide selected from the group consisting of silicate glass, silicon oxide, a material formed using one or more silanes, and tetraethyl orthosilicate (TEOS).

18. The process of claim 16, where the first gaseous etchant to etch the opening having an aspect ratio of at least 15:1 is a mixture of He and Ar.

19. The process of claim 18, where the first gaseous etchant is approximately ninety percent He and approximately ten percent Ar.

20. The process of claim 16, where the opening includes an opening selected from the group consisting of: vias, contacts, and trenches.

21. A process for etching an insulating layer to produce a high aspect ratio contact (HARC), comprising:
etching the insulating layer with a first plasma of a heavy ion etchant to produce the HARC having an aspect ratio of less than 15:1;
further etching the insulating layer with a second plasma of a light ion gaseous etchant to enlarge the HARC to an aspect ratio of at least 20:1;
wherein the light ion gaseous etchant includes at least fifty percent helium (He), and the light ion gaseous etchant has a lower molecular weight than the heavy ion gaseous etchant.

22. The process of claim 21, where the light ion gaseous etchant is He.

23. The process of claim 21, where the heavy ion gaseous etchant includes He.

24. An etching process, comprising:
supplying a gaseous etchant to a plasma etch reactor;
etching a surface of an insulating layer with a plasma of the gaseous etchant to create an opening;
adding at least fifty percent helium (He) to the gaseous etchant once the opening has reached an aspect ratio of at least 15:1; and
forming the opening using the gaseous etchant with at least fifty percent helium (He) added to have a bottom and a side in the insulating layer that allows an axis perpendicular to the insulating layer to pass through the opening to the bottom uninterrupted by the side of the opening and having an aspect ratio of at least 20:1.

25. The process of claim 24, where a distance between the axis perpendicular to the insulating layer and the side is less than approximately forty nm.

26. The process of claim 24, where the gaseous etchant with at least fifty percent helium (He) added is effective to increase the production of the opening as compared to otherwise identical etching with the gaseous etchant lacking at least fifty percent He.

27. The process of claim 24, where the gaseous etchant with at least fifty percent helium (He) added is effective to maintain a constant etch rate as the aspect ratio of the opening reaches and exceeds at least 15:1.

28. A method for operating an etch reactor, comprising:
alternatively supplying a light ion gaseous etchant having at least fifty percent He to the etch reactor, and a heavy ion gaseous etchant comprising Ar, Xe, and combinations thereof, the light ion gaseous etchant having a lower molecular weight than the heavy ion gaseous etchant;
supplying an insulating layer;
first etching an opening to an aspect ratio of less than 15:1 with a first plasma of the heavy ion gaseous etchant; and
second etching with a second plasma of the light ion gaseous etchant the opening having a bottom and a side in the insulating layer that allows an axis perpendicular to the insulating layer to pass through the opening to the bottom uninterrupted by the side of the opening, and having an aspect ratio of at least 15:1, thereby increasing the aspect ratio to greater than 15:1.

29. The method of claim 28, wherein the heavy ion gaseous etchant includes He.

30. The method of claim 28, including:
exchanging the heavy ion gaseous etchant with the light ion gaseous etchant once the aspect ratio of the etched opening reaches approximately 15:1.

* * * * *

UNITED STATES PATENT AND TRADEMARK OFFICE
CERTIFICATE OF CORRECTION

| | |
|---|---|
| PATENT NO. | : 7,608,195 B2 |
| APPLICATION NO. | : 11/358659 |
| DATED | : October 27, 2009 |
| INVENTOR(S) | : Aaron R. Wilson |

Page 1 of 1

It is certified that error appears in the above-identified patent and that said Letters Patent is hereby corrected as shown below:

In column 9, line 15, in Claim 11, delete "there of," and insert -- thereof, --, therefor.

In column 10, line 2, in Claim 21, after "ion" insert -- gaseous --.

Signed and Sealed this

Twelfth Day of January, 2010

David J. Kappos
*Director of the United States Patent and Trademark Office*